(12) United States Patent
Zhou

(10) Patent No.: US 12,433,139 B2
(45) Date of Patent: Sep. 30, 2025

(54) DISPLAY PANEL AND DISPLAY TERMINAL

(71) Applicant: WUHAN CHINA STAR OPTOELECTRONICS SEMICONDUCTOR DISPLAY TECHNOLOGY CO., LTD., Wuhan (CN)

(72) Inventor: Jing Zhou, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 17/787,516

(22) PCT Filed: Jun. 8, 2022

(86) PCT No.: PCT/CN2022/097626
§ 371 (c)(1),
(2) Date: Jun. 20, 2022

(87) PCT Pub. No.: WO2023/226088
PCT Pub. Date: Nov. 30, 2023

(65) Prior Publication Data
US 2024/0188395 A1 Jun. 6, 2024

(30) Foreign Application Priority Data
May 24, 2022 (CN) .......................... 202210574382.3

(51) Int. Cl.
H10K 59/80 (2023.01)
H10K 59/122 (2023.01)
(Continued)

(52) U.S. Cl.
CPC ......... *H10K 59/879* (2023.02); *H10K 59/122* (2023.02); *H10K 59/126* (2023.02); *H10K 59/38* (2023.02)

(58) Field of Classification Search
CPC .... H10K 56/879; H10K 59/122; H10K 59/38; H10K 59/126
See application file for complete search history.

(56) References Cited

U.S. PATENT DOCUMENTS

2019/0165061 A1    5/2019   Jung et al.
2020/0144333 A1*   5/2020   Kim ................ H01L 31/035218
(Continued)

FOREIGN PATENT DOCUMENTS

CN    104282715 A    1/2015
CN    109216581 A    1/2019
(Continued)

OTHER PUBLICATIONS

PCT International Search Report for International Application No. PCT/CN2022/097626, mailed on Dec. 21, 2022, 10pp.
(Continued)

Primary Examiner — Mamadou L Diallo
(74) Attorney, Agent, or Firm — The Roy Gross Law Firm, LLC; Roy D. Gross

(57) ABSTRACT

A display panel and a display terminal are disclosed. The display panel includes: a light-shading layer including a plurality of first openings corresponding to a plurality of luminescent components; a light-concentrating layer at least partly disposed on the light-shading layer and including a plurality of second openings corresponding to and overlapping the first openings; and a color resist layer at least filling the second openings. The light-concentrating layer at least covers a lateral wall of the light-shading layer in the first openings. A refractivity of the light-concentrating layer is
(Continued)

less than a refractivity of the color resist layer. Therefore, power consumption of the display panel is reduced.

20 Claims, 4 Drawing Sheets

(51) Int. Cl.
*H10K 59/126* (2023.01)
*H10K 59/38* (2023.01)

(56) References Cited

U.S. PATENT DOCUMENTS

| | | | |
|---|---|---|---|
| 2020/0185654 A1* | 6/2020 | Luo | G06F 3/0443 |
| 2021/0066667 A1 | 3/2021 | Yun et al. | |
| 2021/0175468 A1* | 6/2021 | Lee | H10K 59/8731 |
| 2022/0037415 A1* | 2/2022 | Lin | H10K 71/00 |
| 2022/0399411 A1* | 12/2022 | Li | H10K 59/126 |
| 2023/0027136 A1* | 1/2023 | Diao | G02B 27/4205 |
| 2024/0268197 A1* | 8/2024 | Feng | H10K 59/8792 |

FOREIGN PATENT DOCUMENTS

| | | | |
|---|---|---|---|
| CN | 114005861 A | * | 2/2022 |
| CN | 114267807 A | | 4/2022 |

OTHER PUBLICATIONS

PCT Written Opinion of the International Search Authority for International Application No. PCT/CN2022/097626, mailed on Dec. 21, 2022, 7pp.

Chinese Office Action issued in corresponding Chinese Patent Application No. 202210574382.3 dated Dec. 8, 2022, pp. 1-9, 22pp.

* cited by examiner

DISPLAY PANEL AND DISPLAY TERMINAL

This application is a National Phase of PCT Patent Application No. PCT/CN2022/097626 having International filing date of Jun. 8, 2022, which claims the benefit of priority of Chinese Application No. 202210574382.3, filed May 24, 2022, the contents of which are all incorporated herein by reference in their entirety.

FIELD

The present disclosure relates to a field of display technologies, and more specifically, to a display panel and a display terminal.

BACKGROUND

Organic light-emitting diode (OLED) panels, such as cellphones and computers, have been widely used in human daily life. In conventional OLED display panels, a polarizer needs to be provided to reduce reflection of ambient light. However, the polarizer significantly reduces light transmittance of luminescent devices. Therefore, non-polarizer technologies have been developed to replace polarizers with a color resist layer.

However, a brightness of conventional non-polarizer OLED display panels viewed from a right front side is still insufficient. To improve the brightness of the conventional non-polarizer OLED display panels viewed from a right front side, power consumption of the OLED display panels needs to be increased.

SUMMARY

The present disclosure provides a display panel and a display terminal, which can improve an issue of an insufficient brightness of conventional non-polarizer OLED display panels viewed from a right front side and an issue of high power consumption.

An embodiment of the present disclosure provides a display panel, comprising:
- a substrate;
- a luminescent layer disposed on the substrate and comprising a plurality of luminescent components;
- a light-shading layer disposed on the luminescent layer and comprising a plurality of first openings corresponding to the luminescent components;
- a light-concentrating layer at least partly disposed on the light-shading layer and comprising a plurality of second openings corresponding to and overlapping the first openings; and
- a color resist layer at least filling the second openings;
- wherein the light-concentrating layer at least covers a lateral wall of the light-shading layer in the first openings, and a refractivity of the light-concentrating layer is less than a refractivity of the color resist layer.

Optionally, in some embodiments of the present disclosure, the light-concentrating layer comprises a plurality of light-concentrating components, the light-concentrating components are disposed on the lateral wall of the light-shading layer in the first openings, and an orthographic projection of the light-concentrating components on the substrate covers an orthographic projection the lateral wall of the light-shading layer in the first openings.

Optionally, in some embodiments of the present disclosure, the light-concentrating layer is disposed on the light-shading layer, and an orthographic projection of the light-concentrating layer on the substrate covers an orthographic projection of the light-shading layer on the substrate.

Optionally, in some embodiments of the present disclosure, an inclined angle between a lateral wall of the light-concentrating layer in the second openings and a bottom surface of the light-concentrating layer is greater than or equal to 45°.

Optionally, in some embodiments of the present disclosure, an inclined angle between the lateral wall of the shading layer in the first openings and a bottom surface of the light-shading layer is less than or equal to the inclined angle between the lateral wall of the light-concentrating layer in the second openings and a bottom surface of the light-concentrating layer.

Optionally, in some embodiments of the present disclosure, a distance between an edge of an orthographic projection of the first openings on the substrate and an edge of an orthographic projection of the second openings on the substrate is greater than or equal to 2 μm.

Optionally, in some embodiments of the present disclosure, the first openings and the second openings have a same shape.

Optionally, in some embodiments of the present disclosure, visible light transmittance of the light-concentrating layer is greater than or equal to 90%.

Optionally, in some embodiments of the present disclosure, surface roughness of a lateral wall of the light-concentrating layer in the second openings is less than surface roughness of the lateral wall of the light-shading layer in the first openings.

Optionally, in some embodiments of the present disclosure, an adhesive force between the light-concentrating layer and the color resist layer is greater than an adhesive force between the color resist layer and the light-shading layer.

Optionally, in some embodiments of the present disclosure, a difference between the refractivity of the color resist layer and the refractivity of the light-concentrating layer is greater than or equal to 0.2 and is less than or equal to 0.5.

Optionally, in some embodiments of the present disclosure, an optical density of the light-shading layer is greater than or equal to 1.5.

Optionally, in some embodiments of the present disclosure, the display panel further comprises:
- a pixel-defining layer disposed on the substrate and comprising a plurality of third openings corresponding to the luminescent components, wherein at least part of the luminescent components are disposed in the third openings; and
- an optical density of the pixel-defining layer is greater than or equal to 0.5.

Optionally, in some embodiments of the present disclosure, material of the pixel-defining layer comprises organic material doped with black material.

Optionally, in some embodiments of the present disclosure, the display panel further comprises:
- a pixel-defining layer disposed on the substrate and comprising a plurality of third openings corresponding to the luminescent components, wherein at least part of the luminescent components are disposed in the third openings; and
- a distance between a center of an orthographic projection of the first openings on the substrate and a center of an orthographic projection of the third openings on the substrate is less than or equal to 1 μm.

Optionally, in some embodiments of the present disclosure, a distance between a center of an orthographic projection of the second openings on the substrate and a center of an orthographic projection of the third openings on the substrate is less than or equal to 1 μm.

Correspondingly, an embodiment of the present disclosure further provides a display terminal, comprising a processor and a display panel, wherein the display panel is electrically connected to the processor, and the display panel comprises:
- a substrate;
- a luminescent layer disposed on the substrate and comprising a plurality of luminescent components;
- a light-shading layer disposed on the luminescent layer and comprising a plurality of first openings corresponding to the luminescent components;
- a light-concentrating layer at least partly disposed on the light-shading layer and comprising a plurality of second openings corresponding to and overlapping the first openings; and
- a color resist layer at least filling the second openings;
- wherein the light-concentrating layer at least covers a lateral wall of the light-shading layer in the first openings, and a refractivity of the light-concentrating layer is less than a refractivity of the color resist layer.

Optionally, in some embodiments of the present disclosure, the light-concentrating layer comprises a plurality of light-concentrating components, the light-concentrating components are disposed on the lateral wall of the light-shading layer in the first openings, and an orthographic projection of the light-concentrating components on the substrate covers an orthographic projection the lateral wall of the light-shading layer in the first openings.

Optionally, in some embodiments of the present disclosure, the light-concentrating layer is disposed on the light-shading layer, and an orthographic projection of the light-concentrating layer on the substrate covers an orthographic projection of the light-shading layer on the substrate.

Optionally, in some embodiments of the present disclosure, an inclined angle between a lateral wall of the light-concentrating layer in the second openings and a bottom surface of the light-concentrating layer is greater than or equal to 45°.

Regarding the Beneficial Effects:
- embodiments of the present disclosure provide a display panel and a display terminal. The display panel includes a substrate; a luminescent layer disposed on the substrate, wherein the luminescent layer includes a plurality of luminescent components; a light-shading layer disposed on the luminescent layer, wherein the light-shading layer includes a plurality of first openings corresponding to the luminescent components; a light-concentrating layer at least partly disposed on the light-shading layer, wherein the light-concentrating layer includes a plurality of second openings corresponding to and overlapping the first openings; and a color resist layer at least filling the second openings. The light-concentrating layer at least covers a lateral wall of the light-shading layer in the first openings. A refractivity of the light-concentrating layer is less than a refractivity of the color resist layer. In the embodiment of the present disclosure, the light-concentrating layer is disposed between the light-shading layer and the color resist layer. The light-concentrating layer at least covers the lateral wall of the light-shading layer in the first openings. When display light emitted from the luminescent components passes through the light-concentrating layer from the color resist layer, the display light will be reflected or refracted by the light-concentrating layer because the refractivity of the light-concentrating layer is less than the refractivity of the color resist layer. Therefore, a brightness of the display panel viewed from a right front side is improved, and power consumption of the display panel can be significantly reduced.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which those skilled in the art can derive further figures without making any inventive efforts.

DETAILED DESCRIPTION

Figure 1:
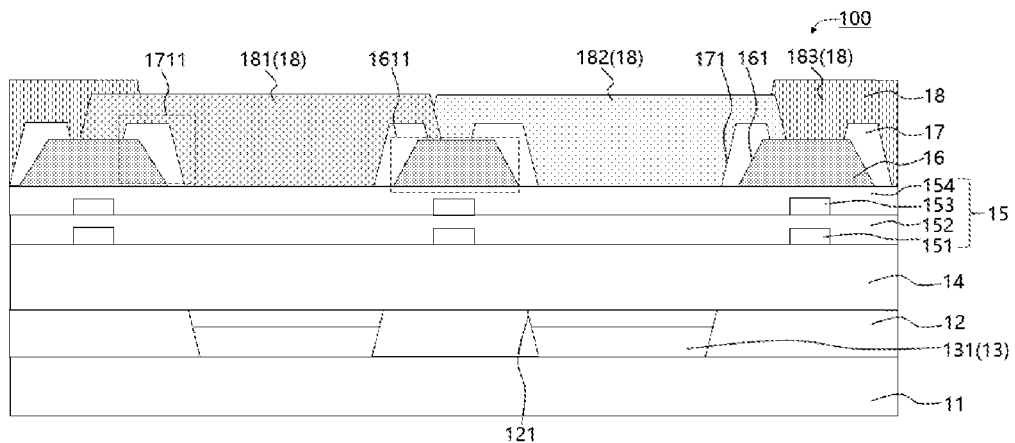
FIG. 1 is a first cross-sectional schematic view showing part of a structure of a first display panel provided by an embodiment of the present disclosure.

Hereinafter preferred embodiments of the present disclosure will be described with reference to the accompanying drawings to exemplify the embodiments of the present disclosure can be implemented, which can fully describe the technical contents of the present disclosure to make the technical content of the present disclosure clearer and easy to understand. However, the described embodiments are only some of the embodiments of the present disclosure, but not all of the embodiments. All other embodiments obtained by those skilled in the art based on the embodiments of the present disclosure without creative efforts are within the scope of the present disclosure. It should be noted that described embodiments are merely used to construct the present disclosure and are not intended to limit the present disclosure. In the present disclosure, unless further description is made, terms such as "top" and "bottom" usually refer to a top of a device and a bottom of a device in an actual process or working status, and specifically, to the orientation as shown in the drawings. Terms such as "inside" and "outside" are based on an outline of a device.

The present disclosure provides a display panel. The display panel includes a substrate; a luminescent layer disposed on the substrate, wherein the luminescent layer includes a plurality of luminescent components; a light-shading layer disposed on the luminescent layer, wherein the light-shading layer includes a plurality of first openings corresponding to the luminescent components; a light-concentrating layer at least partly disposed on the light-shading layer, wherein the light-concentrating layer includes a plurality of second openings corresponding to and overlapping the first openings; and a color resist layer at least filling the second openings. The light-concentrating layer at least covers a lateral wall of the light-shading layer in the first openings. A refractivity of the light-concentrating layer is less than a refractivity of the color resist layer. The present disclosure further provides a display terminal including the above-mentioned display panel. Specific embodiments of the present disclosure are respectively illustrated below in details. It should be noted that a description order of the embodiments below does not mean a preferred order of the embodiments.

First Embodiment

Figure 2:
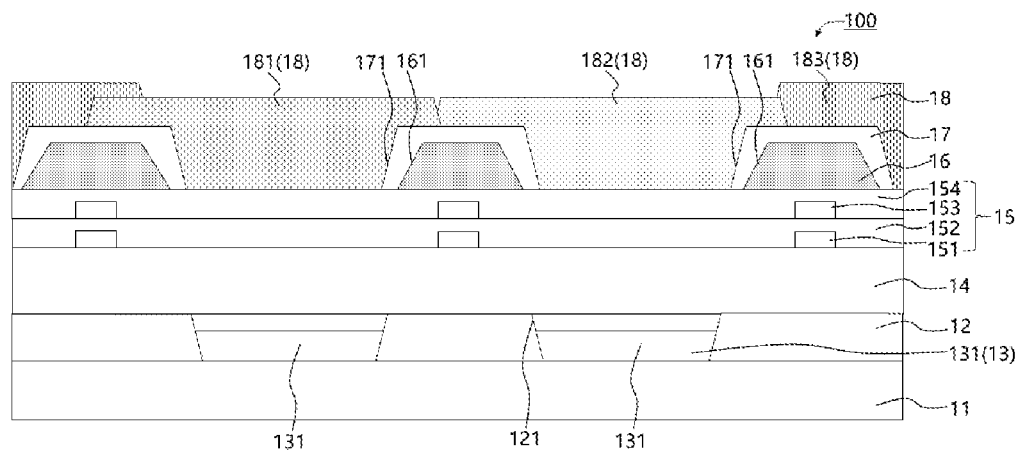
FIG. 2 is a second cross-sectional schematic view showing part of a structure of a second display panel provided by an embodiment of the present disclosure.
Figure 3:
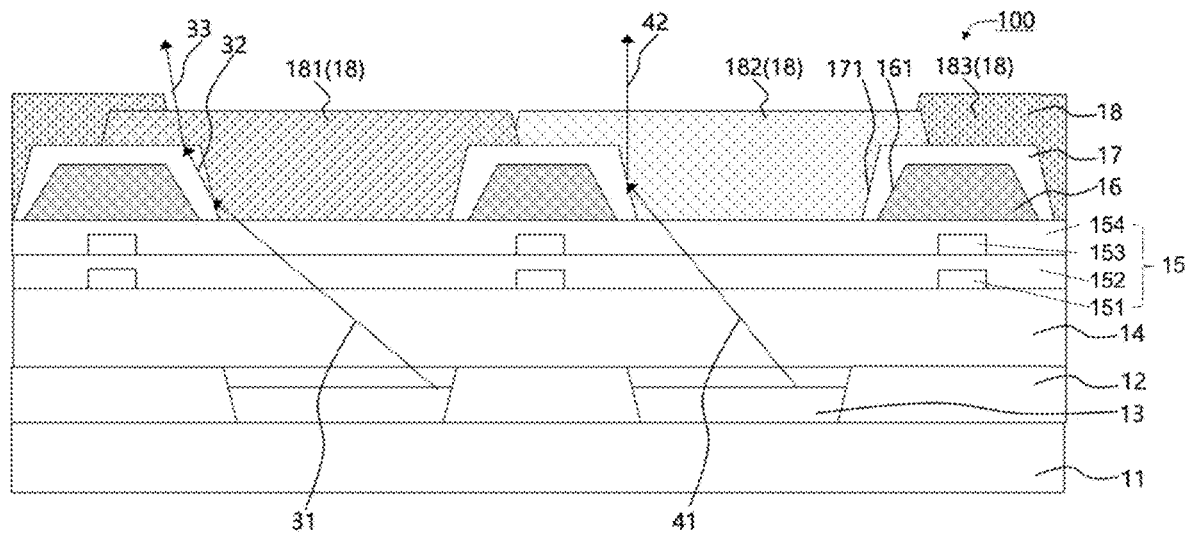
FIG. 3 is a schematic view showing a light concentration process of a display panel provided by an embodiment of the present disclosure.

Please refer to FIGS. 1 to 3. FIG. 1 is a first cross-sectional schematic view showing part of a structure of a first display panel provided by an embodiment of the present disclosure. FIG. 2 is a second cross-sectional schematic view showing part of a structure of a second display panel provided by an embodiment of the present disclosure. FIG. 3 is a schematic view showing a light concentration process of a display panel provided by an embodiment of the present disclosure.

An embodiment of the present disclosure provides a display panel 100. The display panel 100 includes a substrate 11, a luminescent layer 13, a light-shading layer 16, a light-concentrating layer 17, and a color resist layer 18. The luminescent layer 13 is disposed on the substrate 11. The luminescent layer 13 includes a plurality of luminescent components 131. The light-shading layer 16 is disposed on the luminescent layer 13. The light-shading layer 16 includes a plurality of first openings 161 corresponding to the luminescent components 131. The light-concentrating layer 17 is at least partly disposed on the light-shading layer 16. The light-concentrating layer 17 includes a plurality of second openings 171 corresponding to and overlapping the first openings 161. The color resist layer 18 at least fills the second openings 171. The light-concentrating layer 17 at least covers a lateral wall of the light-shading layer 16 in the first openings 161. A refractivity of the light-concentrating layer 17 is less than a refractivity of the color resist layer 18.

Specifically, the substrate 11 may be a flexible substrate or a glass substrate, which is not limited here.

Specifically, the luminescent layer 13 includes a plurality of luminescent components 131. The luminescent components 131 may include a first luminescent component, a second luminescent component, and a third luminescent component. The first luminescent component, the second luminescent component, and the third luminescent component can be a red luminescent component, a green lumines- cent component, and a blue luminescent component, respectively, which is not limited here.

Specifically, the light-shading layer 16 may be a black matrix, which is not limited here.

Specifically, the light-shading layer 16 comprises a plurality of first openings 161 corresponding to the luminescent components 131. An orthographic projection of the first openings 161 on the substrate 11 at least partly overlaps an orthographic projection of the corresponding luminescent components 131 on the substrate 11. The first openings 161 are positions where display light emitted from the luminescent components 131 is emitted, which is not described here in detail.

Specifically, the light-concentrating layer 17 comprises a plurality of second openings 171 corresponding to and overlapping the first openings 161. The light-concentrating layer 17 at least covers the lateral wall of the first openings 161 on the substrate 11. That is, a width or a diameter of the second openings 171 is less than a width or a diameter of the corresponding first openings 161, thereby making the light-concentrating layer 17 at least cover the lateral wall of the light-shading layer 16 in the first openings 161.

Specifically, as shown in FIG. 1 and FIG. 2, the light-concentrating layer 17 covers the lateral wall of the light-shading layer 16 in the first openings 161.

Specifically, the color resist layer 18 at least fills the second openings 171. The color resist layer 18 is disposed in the second openings 171, is disposed in the second openings 171 and on the light-concentrating layer 17, or is disposed in second openings 171, on the light-concentrating layer 17, and on the light-shading layer 16.

Specifically, the color resist layer may include a first color resist 181, a second color resist 182, and a third color resist 183. The first color resist 181, the second color resist 182, and the third color resist 183 may be a red color resist, a green color resist, and a blue color resist, which is not limited here.

Specifically, a refractivity of the light-concentrating layer 17 is less than a refractivity of the color resist layer 18, thereby allowing the light-concentrating layer 17 to concentrate light.

Specifically, when the color resist layer 18 includes the red color resist, the green color resist, and the blue color resist, a refractivity of the red color resist, a refractivity of the green color resist, and a refractivity of the blue color resist are greater than the refractivity of the light-concentrating layer 17.

Specifically, as shown in FIG. 3, in a first situation, first oblique display light 31 emitted from the luminescent components 131 is refracted after passing through the color resist layer 18 and the light-concentrating layer 17. Because the refractivity of the light-concentrating layer 17 is less than the refractivity of the color resist layer 18, the first oblique display light 31 is refracted after passing through the light-concentrating layer 17 and is converted into first refracted display light 32. Compared to the first oblique display light 31, the first refracted display light 32 is more like right front view light. The first refracted display light 32 is further converted into second refracted display light 33 after being refracted by the light-concentrating layer 17. Compared to the first refracted display light 32, the second refracted display light 32 is more like the right front view light. Finally, the first oblique display light 31 is converted into the right front view light or light close to the right front view light. As such, light is concentrated. Therefore, a brightness of the display panel viewed from a right front side can be increased with reduced power consumption of the display panel.

Specifically, as shown in FIG. 3, in a second situation, second oblique display light 41 emitted from the luminescent components 131 is refracted after passing through the color resist layer 18 and the light-concentrating layer 17. Because the refractivity of the light-concentrating layer 17 is less than the refractivity of the color resist layer 18, the second oblique display light 41 is reflected by a surface of the light-concentrating layer 17. Compared to the second oblique display light 41, the first reflected display light 42 is more like right front view light. Finally, the second oblique display light 41 is converted into the right front view light or light close to the right front view light. As such, light is concentrated. Therefore, a brightness of the display panel viewed from a right front side can be increased with reduced power consumption of the display panel.

Furthermore, a surface of a lateral wall of the light-concentrating layer 17 in the second openings 171 may be a smooth surface, thereby improving a capability of the light-concentrating layer 17 to reflect or concentrate display light.

In the present embodiment, the light-concentrating layer 17 is disposed between the light-shading layer 16 and the color resist layer 18. The light-concentrating layer 17 at least covers the lateral wall of the light-shading layer 16 in the first openings 161. When display light emitted from the luminescent components 131 passes through the light-concentrating layer 17 from the color resist layer 18, the display light is reflected or refracted by the light-concentrating layer 17 because the refractivity of the light-concentrating layer 17 is less than the refractivity of the color resist layer 18. Emitting angles of display light are concentrated after the light-concentrating layer 17 is reflected or refracted. Therefore, a brightness of the display panel 100 viewed from a right front side can be increased with reduced power consumption of the display panel 100.

Second Embodiment

A display panel provided by the present embodiment is same as or similar to the display panel 100 of the first embodiment. The present embodiment further describes a structure of the display panel.

In the present embodiment, as shown in FIG. 1, the light-concentrating layer 17 includes a plurality of light-concentrating components 1711. The light-concentrating components 1711 are disposed on the lateral wall of the light-shading layer 16 in the first openings 161. Furthermore, an orthographic projection of the light-concentrating components 1711 on the substrate covers an orthographic projection of the lateral wall of the light-shading layer 16 in the first openings 161.

Specifically, the light-concentrating layer 17 includes the light-concentrating components 1711. The light-concentrating components 1711 are disposed on the lateral wall of the light-shading layer 16 in the first openings 161. Two light-concentrating components 1711 respectively disposed in two adjacent second openings 171 are separated from each other. This configuration can also achieve the beneficial effects of the first embodiment.

Specifically, the light-shading layer 16 includes a plurality of light-shading components 1611. An orthographic projection of the light-concentrating components 1711 on the substrate 11 covers an orthographic projection of a lateral wall of the corresponding light-shading components 1611 in the first openings 161. In a cross-sectional view of FIG. 1, two light-concentrating components 1711 correspond to one light-shading component 1611. One light-shading component 1611 corresponds to two light-concentrating components 1711 separated from each other. That is, one light-shading component 1611 corresponds to two light-concentrating components 1711 which are not in contact with each other.

Third Embodiment

A display panel provided by the present embodiment is same as or similar to the display panel 100 of the first embodiment. The present embodiment further describes a structure of the display panel.

In some embodiments, as shown in FIG. 2, the light-concentrating layer 17 is disposed on the light-shading layer 16, and an orthographic projection of the light-concentrating layer 17 on the substrate 11 covers an orthographic projection of the light-shading layer 16 on the substrate 11.

Specifically, the light-concentrating layer 17 disposed in two adjacent second openings 171 are connected to each other and are an integration. This configuration can achieve the beneficial effects of the first embodiment, and can further reduce a pattern of the light-concentrating layer 17, which is beneficial for improving a yield rate.

Fourth Embodiment

A display panel provided by the present embodiment is same as or similar to the display panel 100 of the first embodiment. The present embodiment further describes a structure of the display panel.

Figure 4:
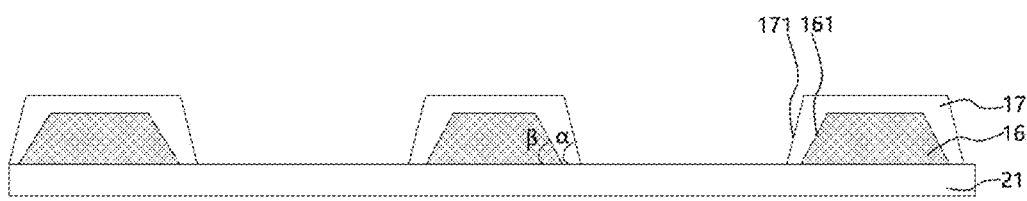
FIG. 4 is a schematic view showing an inclined angle of a light-concentrating layer and an inclined angle of a light-shading layer of the display panel provided by the embodiment of the present disclosure.
Figure 5:
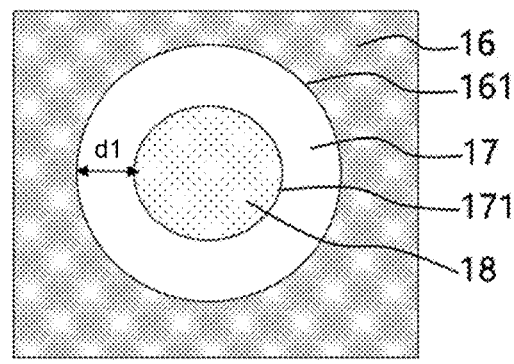
FIG. 5 is a first schematic view showing an orthographic projection of the light-concentrating layer and an orthographic projection of the light-shading layer on the substrate of the display panel provided by the embodiment of the present disclosure.
Figure 6:
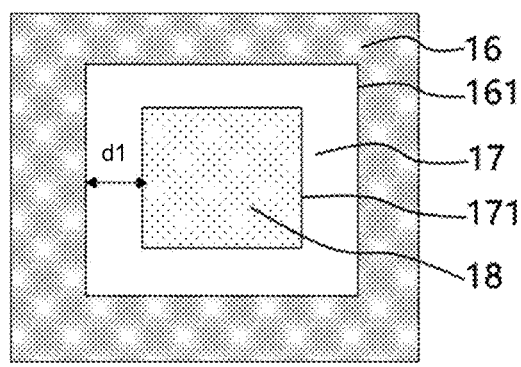
FIG. 6 is a second schematic view showing an orthographic projection of the light-concentrating layer and an orthographic projection of the light-shading layer on the substrate of the display panel provided by the embodiment of the present disclosure.
Figure 7:
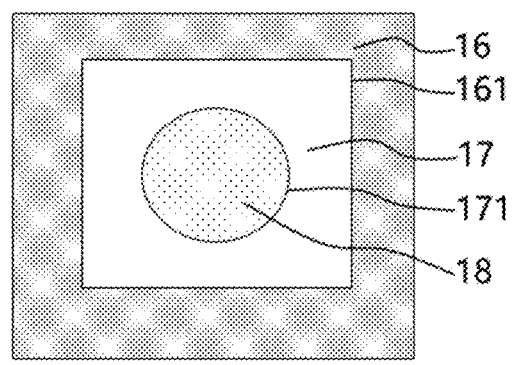
FIG. 7 is a third schematic view showing an orthographic projection of the light-concentrating layer and an orthographic projection of the light-shading layer on the substrate of the display panel provided by the embodiment of the present disclosure.
Figure 8:
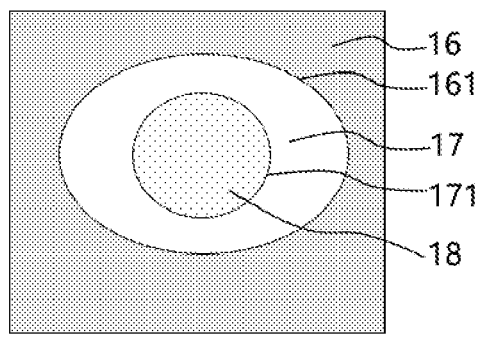
FIG. 8 is a fourth schematic view showing an orthographic projection of the light-concentrating layer and an orthographic projection of the light-shading layer on the substrate of the display panel provided by the embodiment of the present disclosure.

Please refer to FIGS. 4 to 8. FIG. 4 is a schematic view showing an inclined angle of a light-concentrating layer and an inclined angle of a light-shading layer of the display panel provided by the embodiment of the present disclosure. FIG. 5 is a first schematic view showing an orthographic projection of the light-concentrating layer and an orthographic projection of the light-shading layer on the substrate of the display panel provided by the embodiment of the present disclosure. FIG. 6 is a second schematic view showing an orthographic projection of the light-concentrating layer and an orthographic projection of the light-shading layer on the substrate of the display panel provided by the embodiment of the present disclosure. FIG. 7 is a third schematic view showing an orthographic projection of the light-concentrating layer and an orthographic projection of the light-shading layer on the substrate of the display panel provided by the embodiment of the present disclosure. FIG. 8 is a fourth schematic view showing an orthographic projection of the light-concentrating layer and an orthographic projection of the light-shading layer on the substrate of the display panel provided by the embodiment of the present disclosure.

In some embodiments, an inclined angle between a lateral wall of the light-concentrating layer 17 in the second openings 171 and a bottom surface of the light-concentrating layer 17 is greater than or equal to 45°.

Specifically, as shown in FIG. 4, a first inclination angle α is defined between the lateral of the light-concentrating 17 in the second openings 171 and the bottom surface of the light-concentrating layer 17. The first inclination angle α is greater than or equal to 45°. Specifically, as shown in FIG. 4, part of the light-concentrating layer 17 and the light-shading layer 16 are disposed on a first film layer 21 of the display panel 100. The first film layer 21 may be an encapsulation layer 14 or a touch control layer 15. A structure of the first film layer 21 will be described later. A specific structure name and a function of the first film layer 21 are not limited as long as the first film layer can support the part of the light-concentrating layer 17 and the light-shading layer 16.

Specifically, the bottom surface of the light-concentrating layer 17 is a surface of the light-concentrating layer 17 in contact with the first film layer 21, or is a surface of the light-concentrating layer 17 close to the substrate 11.

Specifically, as shown in FIG. 4, an inclination angle of the light-concentrating layer 17 on a surface of the first film layer 21 is greater than or equal to 45°. That is, the first inclination angle $\alpha$ is greater than or equal to 45°.

Specifically, when the first inclination angle $\alpha$ is greater than or equal to 45°, light reflected or refracted by the light-concentrating layer 17 is more like right front view light. Therefore, a better light concentration effect can be achieved. As such, a brightness of the display panel 100 viewed from a right front side can be increased with reduced power consumption of the display panel 100.

In some embodiments, an inclined angle between a lateral wall of the light-shading layer 16 in the first openings 161 and a bottom surface of the light-shading layer 16 is less than or equal to an inclined angle between the lateral wall of the light-concentrating layer 17 in the second openings 171 and the bottom surface of the light-concentrating layer 17.

Specifically, the bottom surface of the light-shading layer 16 is a surface of the light-shading layer 16 in contact with the first film layer 21, or is a surface of the light-shading layer 16 close to the substrate 11.

Specifically, as shown in FIG. 4, a second inclination angle $\beta$ is defined between the lateral wall of the light-shading layer 16 in the first openings 161 and the bottom surface of the light-shading layer 16. That is, the inclined angle of the light-shading layer 16 on a surface of the first film layer 21 is the second inclination angle $\beta$, and the second inclination angle $\beta$ is less than the first inclination angle $\alpha$.

Specifically, as shown in FIG. 3, the second inclination angle $\beta$ is less than the first inclination angle $\alpha$, thereby preventing the first refracted display light 32 from being blocked or absorbed by the light-shading layer 16, and further preventing loss of light. As such, a brightness of the display panel 100 viewed from a right front side can be increased with reduced power consumption of the display panel 100.

Furthermore, preferably, the first inclination angle $\alpha$ is greater than or equal to 45°, and the second inclination angle $\beta$ is less than or equal to 45°, thereby reducing loss of light.

In some embodiments, a distance between an edge of an orthographic projection of the first openings 161 on the substrate 11 and an edge of an orthographic projection of the corresponding second openings on the substrate 11 is greater than or equal to 2 μm.

Specifically, as shown in FIG. 5 and FIG. 6, a distance d1 is defined between the edge of the orthographic projection of the first openings 161 on the substrate 11 and the edge of the orthographic projection of the corresponding second openings on the substrate 11. The first distance d1 is greater than or equal to 2 μm.

Specifically, in manufacturing processes of the light-concentrating layer, a deviation of alignment or pattern may occur. By making the first distance d1 be greater than or equal to 2 μm, all light-shading layer 16 in the first openings 161 on the display panel 100 can be covered by the light-concentrating layer 17, thereby preventing the light-shading layer 16 from being exposed by the first openings 161.

In some embodiments, the first openings 161 and the second openings 171 have a same shape.

Specifically, the first openings 161 and the second openings 171 have the same shape, thereby allowing a light concentration effect in each part of the light-concentrating layer 17 can be same or similar. As such, a color shading issue is prevented.

Specifically, as shown in FIG. 5, the first openings 161 and the second openings 171 are circular. As shown in FIG. 6, the first openings 161 and the second openings 171 are rectangular.

It should be noted that, in some display panels 100, demands for a color shading issue may be reduced. Therefore, the first openings 161 and the second openings 171 may have different shapes. For example, as shown in FIG. 7, the first openings 161 are rectangular, and the second openings 171 are circular. As shown in FIG. 8, the first openings 161 are elliptical, and the second openings are elliptical.

Furthermore, in some embodiments, the light-concentrating layer 17 includes transparent material.

Specifically, the light-concentrating layer 17 includes the transparent material. Therefore, the light-concentrating layer 17 can refract display light emitted from the luminescent components 131. By cooperating reflection and refraction, the display light can be better concentrated.

In some embodiments, visible light transmittance of the light-concentrating layer 17 is greater than or equal to 90%.

Specifically, the visible light transmittance of the light-concentrating layer 17 is greater than or equal to 90%, thereby reducing absorption of display light emitted from the luminescent components 131 by the light-concentrating layer. As such, a brightness of the display panel 100 is increased, and power consumption of the display panel 100 is reduced.

Furthermore, in some embodiments, material of the light-concentrating layer includes at least one of polymethyl methacrylate (PMMA), polyimide (PI), or polyethylene terephthalate (PET).

Furthermore, the light-concentrating layer 17 and an over coating (OC) layer may have the same material.

In some embodiments, surface roughness of the lateral wall of the light-concentrating layer 17 in the second openings 171 is less than surface roughness of the lateral wall of the light-shading layer 16 in the first openings 161.

Specifically, by reducing the surface roughness of the lateral wall of the light-concentrating layer 17 in the second openings 171 or making the surface roughness of the lateral wall of the light-concentrating layer 17 in the second openings 171 be smooth, diffuse reflection of light can be prevented from occurring on a surface of the lateral wall of the light-concentrating layer 17 in the second openings 171. As such, loss of light can be reduced, thereby preventing a color shading issue.

In some embodiments, an adhesive force between the light-concentrating layer 17 and the color resist layer 18 is greater than an adhesive force between the color resist layer 18 and the light-shading layer 16.

Specifically, in the embodiment as shown in FIG. 1, an adhesive force between the light-concentrating components 1711 and the color resist layer 18 is greater than the adhesive force between the color resist layer 18 and the light-shading layer 16.

Specifically, the adhesive force between the light-concentrating layer 17 and the color resist layer 18 is greater than the adhesive force between the color resist layer and the light-shading layer 16, thereby increasing adhesive strength between the light-shading layer 16, the light-concentrating layer 17, and the color resist layer 18. As such, film layers are prevented from being separated, and film layers of the light-concentrating layer 17 or the light-concentrating components 1711 are prevented from being separated due to a relatively low contact area.

Furthermore, a difference between refractivity of the light-concentrating layer 17 and refractivity of the light-shading layer 16 is small, or the difference between the refractivity of the light-concentrating layer 17 and the refractivity of the light-shading layer 16 is less than or equal to 0.5. Therefore, optical phenomena of display light, such as reflection and refraction, are prevented from occurring on an interface between the light-concentrating layer 17 and the light-shading layer 16. Thus, loss of display light is prevented.

Furthermore, refractivity of the color resist layer 18 is greater than the refractivity of the light-concentrating layer 17, or the refractivity of the color resist layer 18 is 0.1 greater than the refractivity of the light-concentrating layer 17. This configuration can achieve a better light concentration effect.

In some embodiments, the refractivity of the color resist layer 18 is larger than the refractivity of the light-concentrating layer 17. A difference between the refractivity of the color resist layer 18 and the refractivity of the light-concentrating layer 17 is greater than or equal to 0.2 and is less than or equal to 0.5.

Specifically, the refractivity of the color resist layer 18 is greater than the refractivity of the light-concentrating layer 17. The difference between the refractivity of the color resist layer 18 and the refractivity of the light-concentrating layer 17 is greater than or equal to 0.2. This configuration can achieve a better light concentration effect.

Specifically, the refractivity of the color resist layer 18 is greater than the refractivity of the light-concentrating layer 17, and the difference between the refractivity of the color resist layer 18 and the refractivity of the light-concentrating layer 17 is less than or equal to 0.5. As such, an overly strong effect of light concentration due to the refractivity of the color resist layer 18 overly greater than the refractivity of the light-concentrating layer 17 is prevented. Therefore, a brightness of the display panel viewed from a lateral side or an oblique side would not be too low.

In some embodiments, the optical density of the light-shading layer 16 is greater than or equal to 1.5.

Specifically, the optical density of the light shielding layer 16 is greater than or equal to 1.5, which can better absorb ambient light, thereby reducing reflection of ambient light.

Furthermore, material of the light-shading layer 16 may include first host material doped with black material. The first host material may be acrylic material or other material, and the black material may include carbon black, organic black dye, or organic black pigment.

In some embodiments, the display panel 100 further includes a pixel-defining layer 12. The pixel-defining layer 12 is disposed on the substrate 11. The pixel-defining layer 12 includes a plurality of third openings 121 corresponding to the luminescent components 131. The luminescent components 131 are at least partially disposed in the third openings 121. An optical density of the pixel-defining layer 12 is greater than or equal to 0.5.

Specifically, the optical density of the pixel defining layer 12 is greater than or equal to 0.5, which can better absorb ambient light entering an interior of the display panel 100, thereby reducing reflection of ambient light.

Furthermore, material of the pixel-defining layer 12 may include a second host material doped with black material. The second host material may be acrylic material or other material, and the black material may include carbon black, organic black dye, or organic black pigment.

In some embodiments, the material of the pixel defining layer 12 includes organic material doped with the black material.

Specifically, the material of the pixel-defining layer 12 includes the organic material doped with the black material. Therefore, the pixel-defining layer 12 can better absorb ambient light.

In some embodiments, the display panel 100 further includes the pixel-defining layer 12. The pixel-defining layer 12 is disposed on the substrate 11. The pixel-defining layer 12 includes the third openings 121 corresponding to the luminescent components 131. The luminescent components 131 are at least partially disposed in the third openings 121. A distance between a center of the orthographic projection of the first openings 161 on the substrate 11 and a center of the orthographic projection of the third openings 121 on the substrate 11 is less than or equal to 1 μm.

Specifically, the distance between the center of the orthographic projection of the first openings 161 on the substrate 11 and the center of the orthographic projection of the third openings 121 on the substrate 11 is less than or equal to 1 μm. Therefore, Dislocation of the first openings 161 and the third openings 121 is prevented from being overly great. The light-shading layer 16 normally blocks display light, which can ensure uniformity of the display light emitted from the luminescent components 131 from a surface of the display panel 100. In addition, a color shading issue can be prevented.

In some embodiments, a distance between a center of the orthographic projection of the second openings 171 on the substrate 11 and a center of an orthographic projection of the third openings 121 on the substrate 11 is less than or equal to 1 μm.

Specifically, the distance between the center of the orthographic projection of the second openings 171 on the substrate 11 and the center of the orthographic projection of the third openings 121 on the substrate 11 is less than or equal to 1 μm. Dislocation of the second openings 171 and the third openings 121 is prevented from being overly great. Each part of the light-concentrating layer 17 can well and evenly concentrate light, which can ensure uniformity of the display light emitted from the luminescent components 131 from a surface of the display panel 100. In addition, a color shading issue can be prevented.

It should be noted that, as shown in FIGS. 1 to 3, a cross-sectional structure of the display panel 100 is illustrated. A layer structure of the display panel 100 at least sequentially includes the substrate 11, the pixel-defining layer 12 and the luminescent layer 13 disposed on the substrate 11, the encapsulation layer 14 disposed on the luminescent layer 13 and the pixel-defining layer 12, the touch layer 15 disposed on the encapsulation layer 14, and the light-shading layer 16 disposed on the touch control layer 15. The display panel 100 may further include other structures or may be other structures, which is not described here in detail.

It should be noted that a layer structure of the touch layer 15 may sequentially include a first touch control metal 151, a first touch control insulating layer 152, a second touch control metal 153, a second touch control insulating layer 154. The structure of the touch control layer 15 is not limited thereto, which is not described here in detail.

It should be noted that the display panel 100 may not include the touch layer 15, which is not limited here.

It should be noted that the light shielding layer 16 may be directly disposed on the encapsulation layer 14.

It should be noted that a thin film transistor (TFT) array layer may further be disposed between the substrate 11 and the pixel-defining layer 12. The TFT array layer includes a plurality of structures, such as TFTs and wirings, arranged in an array manner, which is not described herein in detail.

It should be noted that some embodiments further provide a method of manufacturing a display panel. The method includes following steps: forming a flexible substrate on a glass substrate; forming a TFT array layer, a luminescent layer, an encapsulation layer, and a touch control layer on the flexible substrate; forming a light-shading layer on the touch control layer; coating material of a light-concentrating layer (such as an over coating layer), and patterning the material of the light-concentrating layer. Therefore, the light-concentrating layer can completely enclose or cover a lateral wall of the light-shading layer in a plurality of first openings, thereby forming a color resist layer.

Fifth Embodiment

Figure 9:
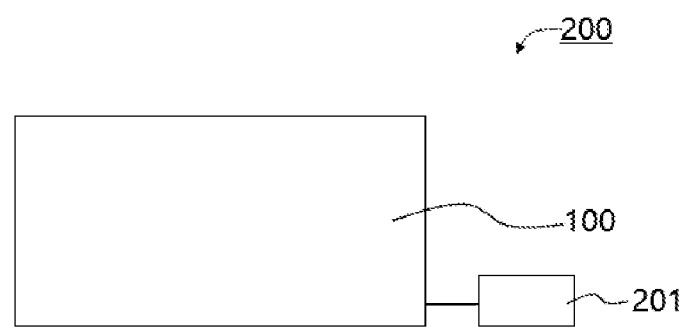
FIG. 9 is a schematic view showing a display terminal provided by an embodiment of the present disclosure.

Please refer to FIG. 9, a schematic view showing a display terminal 200 provided by an embodiment of the present disclosure is provided.

An embodiment of the present disclosure further provides a display terminal 200. The display terminal 200 includes a processor 201 and any one of the above-mentioned display panels 100. The display panel 100 is electrically connected to the processor 201.

Specifically, the processor 201 may provide the display panel 100 with an electrical signal or/and a control signal.

Specifically, the display terminal 200 may be a cellphone, a notebook, or a television.

A display panel and a display terminal provided by the embodiments of the present disclosure have been described in detail, which illustrate principles and implementations thereof. However, the description of the above embodiments is only for helping to understand the technical solution of the present disclosure and core ideas thereof, and it is understood by those skilled in the art that many changes and modifications to the described embodiments can be carried out without departing from the scope and the spirit of the disclosure that is intended to be limited only by the appended claims.

What is claimed is:

1. A display panel, comprising:
a substrate;
a luminescent layer disposed on the substrate and comprising a plurality of luminescent components;
a light-shading layer disposed on the luminescent layer and comprising a plurality of first openings corresponding to the luminescent components;
a light-concentrating layer at least partly disposed on the light-shading layer and comprising a plurality of second openings corresponding to and overlapping the first openings; and
a color resist layer filling the second openings and covering a side of the light-concentrating layer away from the substrate and a side of the light-shading layer away from the substrate;
wherein the light-concentrating layer at least covers a lateral wall of the light-shading layer in the first openings, and a refractivity of the light-concentrating layer is less than a refractivity of the color resist layer.

2. The display panel of claim 1, wherein the light-concentrating layer comprises a plurality of light-concentrating components, the light-concentrating components are disposed on the lateral wall of the light-shading layer in the first openings, and an orthographic projection of the light-concentrating components on the substrate covers an orthographic projection the lateral wall of the light-shading layer in the first openings,
wherein the color resist layer comprises a first color resist layer, a second color resist layer, and a third color resist layer, two adjacent ones of the first color resist layer, the second color resist layer, and the third color resist layer are connected with each other on a top surface of the light-shading layer.

3. The display panel of claim 1, wherein the light-concentrating layer is disposed on the light-shading layer, and an orthographic projection of the light-concentrating layer on the substrate covers an orthographic projection of the light-shading layer on the substrate,
wherein the color resist layer comprises a first color resist layer, a second color resist layer, and a third color resist layer, two adjacent ones of the first color resist layer, the second color resist layer, and the third color resist layer are connected with each other on a top surface of the light-concentrating layer.

4. The display panel of claim 1, wherein an inclined angle between a lateral wall of the light-concentrating layer in the second openings and a bottom surface of the light-concentrating layer is greater than or equal to 45°.

5. The display panel of claim 4, wherein an inclined angle between the lateral wall of the shading layer in the first openings and a bottom surface of the light-shading layer is less than or equal to the inclined angle between the lateral wall of the light-concentrating layer in the second openings and a bottom surface of the light-concentrating layer.

6. The display panel of claim 1, wherein a distance between an edge of an orthographic projection of the first openings on the substrate and an edge of an orthographic projection of the second openings on the substrate is greater than or equal to 2 μm.

7. The display panel of claim 1, wherein the first openings and the second openings have a same shape.

8. The display panel of claim 1, wherein visible light transmittance of the light-concentrating layer is greater than or equal to 90%.

9. The display panel of claim 1, wherein surface roughness of a lateral wall of the light-concentrating layer in the second openings is less than surface roughness of the lateral wall of the light-shading layer in the first openings.

10. The display panel of claim 2, wherein an adhesive force between the light-concentrating layer and the color resist layer is greater than an adhesive force between the color resist layer and the light-shading layer.

11. The display panel of claim 1, wherein a difference between the refractivity of the color resist layer and the refractivity of the light-concentrating layer is greater than or equal to 0.2 and is less than or equal to 0.5.

12. The display panel of claim 1, wherein an optical density of the light-shading layer is greater than or equal to 1.5.

13. The display panel of claim 1, comprising:
a pixel-defining layer disposed on the substrate and comprising a plurality of third openings corresponding to the luminescent components, wherein at least part of the luminescent components are disposed in the third openings; and an optical density of the pixel-defining layer is greater than or equal to 0.5.

14. The display panel of claim 13, wherein material of the pixel-defining layer comprises organic material doped with black material.

15. The display panel of claim 1, further comprising:
a pixel-defining layer disposed on the substrate and comprising a plurality of third openings corresponding to the luminescent components, wherein at least part of the luminescent components are disposed in the third openings; and
a distance between a center of an orthographic projection of the first openings on the substrate and a center of an orthographic projection of the third openings on the substrate is less than or equal to 1 μm.

16. The display panel of claim 15, wherein a distance between a center of an orthographic projection of the second openings on the substrate and a center of an orthographic projection of the third openings on the substrate is less than or equal to 1 μm.

17. A display terminal, comprising a processor and a display panel, wherein the display panel is electrically connected to the processor, and the display panel comprises:
a substrate;
a luminescent layer disposed on the substrate and comprising a plurality of luminescent components;
a light-shading layer disposed on the luminescent layer and comprising a plurality of first openings corresponding to the luminescent components;
a light-concentrating layer at least partly disposed on the light-shading layer and comprising a plurality of second openings corresponding to and overlapping the first openings; and
a color resist layer filling the second openings and covering a side of the light-concentrating layer away from the substrate and a side of the light-shading layer away from the substrate;

wherein the light-concentrating layer at least covers a lateral wall of the light-shading layer in the first openings, and a refractivity of the light-concentrating layer is less than a refractivity of the color resist layer.

18. The display terminal of claim 17, wherein the light-concentrating layer comprises a plurality of light-concentrating components, the light-concentrating components are disposed on the lateral wall of the light-shading layer in the first openings, and an orthographic projection of the light-concentrating components on the substrate covers an orthographic projection the lateral wall of the light-shading layer in the first openings,
wherein the color resist layer comprises a first color resist layer, a second color resist layer, and a third color resist layer, two adjacent ones of the first color resist layer, the second color resist layer, and the third color resist layer are connected with each other on a top surface of the light-shading layer.

19. The display terminal of claim 17, wherein the light-concentrating layer is disposed on the light-shading layer, and an orthographic projection of the light-concentrating layer on the substrate covers an orthographic projection of the light-shading layer on the substrate,
wherein the color resist layer comprises a first color resist layer, a second color resist layer, and a third color resist layer, two adjacent ones of the first color resist layer, the second color resist layer, and the third color resist layer are connected with each other on a top surface of the light-concentrating layer.

20. The display terminal of claim 17, wherein an inclined angle between a lateral wall of the light-concentrating layer in the second openings and a bottom surface of the light-concentrating layer is greater than or equal to 45°.

* * * * *